United States Patent [19]

Chung et al.

[11] Patent Number: 5,460,794
[45] Date of Patent: Oct. 24, 1995

[54] METHOD OF MANUFACTURING A POWDERY ALN

[75] Inventors: Shyan-Lung Chung; Chang-Lin Tu; Wei-Chang Lee, all of Tainan, Taiwan

[73] Assignee: National Science Council, Taipei, Taiwan

[21] Appl. No.: 105,501

[22] Filed: Aug. 11, 1993

[51] Int. Cl.$^6$ .................................................. C01B 21/072
[52] U.S. Cl. .................................................. 423/412
[58] Field of Search .................................................. 423/412

[56] References Cited

U.S. PATENT DOCUMENTS

| 3,607,046 | 9/1971 | Little et al. | 423/412 |
| 4,877,759 | 10/1989 | Holt et al. | 423/412 |

FOREIGN PATENT DOCUMENTS

| 63-274605 | 11/1988 | Japan . |
| 64-76906 | 3/1989 | Japan . |
| 64-76905 | 3/1989 | Japan . |

OTHER PUBLICATIONS

J. Birch Holt, "Combustion Synthesis: A New Area of Research in Materials Science", *Energy & Technology Review*, Lawrence Livermore National Laboratory (Jan., 1984).

Marc Costantino et al., "High Pressure Combustion Synthesis of Aluminum Nitride" J. Mater. Res., vol. 6 No. 11, Nov. 1991, 2397.

*Primary Examiner*—Wayne Langel
*Attorney, Agent, or Firm*—W. Wayne Liauh

[57] ABSTRACT

A method of manufacturing a powdery AlN comprising steps of: a) providing an airtight vessel, b) preparing a powdery Al and a solid-state nitride, c) wrapping up the powdery Al and the solid-state nitride with an igniting agent, d) putting the wrapped Al and nitride into the vessel, e) evacuating the airtight vessel and filling therein with an N gas, and f) igniting the igniting agent. Since the powdery Al and solid-state nitride are completely wrapped up with an igniting agent, the reaction can be more rapidly and fully completed under a relatively low pressure. In addition, the present method can be used to obtain an AlN having a high purity.

17 Claims, 2 Drawing Sheets

METHOD OF MANUFACTURING A POWDERY ALN

BACKGROUND OF THE INVENTION

The present invention relates generally to a method of manufacturing a powdery AlN, and more particularly to a combustion synthesis method of manufacturing a powdery AlN. Having a high thermal conductivity, a high electrical resistivity, a good mechanical strength, and a good oxidation and thermal-shock resistance, AlN becomes a very important ceramic material in industrial applications. It can be used for high-performance electronic substrate material, optical lenses, cutting tools, heat sinks, and many high-temperature structure materials.

The manufacturing methods for AlN include:

1) the gas phase reaction method, e.g.,

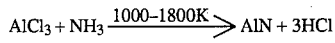

$$AlCl_3 + NH_3 \xrightarrow{1000-1800K} AlN + 3HCl$$

2) the direct nitridation method, e.g.,

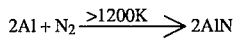

$$2Al + N_2 \xrightarrow{>1200K} 2AlN$$

3) the reduction-nitridation method, e.g.,

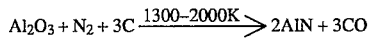

$$Al_2O_3 + N_2 + 3C \xrightarrow{1300-2000K} 2AlN + 3CO$$

4) the combustion synthesis method.

The gas reaction method is not suitable for mass production of AlN in industry because of the high cost and slow manufacturing rate involved.

The direct nitridation of Al and the nitridation of powdery $Al_2O_3$ methods require a process executed under a high temperature and a long period of time, e.g., 5 hours, to fully complete the reaction, which can thus result in common disadvantages including a greater energy consumption and a slow manufacturing rate.

In comparison to other methods, the combustion synthesis method is a new method used to synthesize ceramic materials by self-propagation combustion reactions. The advantages achieved thereby include that it has a fast reaction rate, a less energy consumption and a simple manufacturing process and that it can be used for mass production. Several combustion synthesis examples are as follows:

1) The Japanese Patent Publication NO. 63-274605: Al, AlN and $CaCO_3$ (or other additives) powders, in an appropriate ratio, are mixed and then pressed into pellets. The pellets are ignited by electrical heating under 50 atm $N_2$ gas to form the powdery AlN.

2) The Japanese Patent Publication No. 64-76906: Al and powdery AlN in an appropriate ratio, are mixed and placed in a porous, refractory vessel surrounded by liquid nitrogen. The synthesis reaction is ignited by electrical heating to form powdery AlN.

3) The Japanese Patent Publication No. 64-76905: Powdery Al and $NaN_3$ (or other solid-state nitrides, e.g., $KN_3$, $Ba_3N_2$ . . . etc.) in an appropriate ratio, are mixed and put into a refractory vessel. An igniting agent is placed on the top of the powder mixture. The vessel is then placed in an electrical oven which is enclosed in a container filled with $N_2$ gas (having a pressure smaller than 10 $kg/cm^2$). The powdery AlN can thus be formed by first heating the powdery Al and $NaN_3$ in the oven and then igniting the igniting agent to start and complete the combustion synthesis reaction. The above combustion synthesis technology for the production of powdery AlN still has two key problems to be overcome, i.e.

1) How to supply sufficient nitrogen and to have it mixed thoroughly with the powdery Al; and 2) How to fully complete the reaction.

According to the reported study (such as M. Costantino and C. Firpo, J. Mater. Res. 6:2397(1991)), if the $N_2$ gas is used as the nitrogen source, the pressure thereof must be greater than 1000 atm to start the reaction.

The aforementioned Japanese Patent Publication No. 63-274605 uses 50 atm $N_2$ gas which is still a relatively high pressure. Such high pressure of $N_2$ gas will not only result in a higher cost on apparatus and operation, but in more complexity and danger during the operation as well.

If liquid nitrogen is used as the nitrogen source (such as the Japanese Patent Publication No. 64-76906), the high pressure of $N_2$ gas is not necessary. The low temperature of the liquid nitrogen, however, will not only result in a higher cost on apparatus and operation, but in more complexity and danger during the operation as well.

If a solid-state nitride is used as the nitrogen source (e.g., in the Japanese Patent Publication No. 64-76905), the high pressure of $N_2$ gas is also not necessary. However, in order that the reaction can proceed in a self-propagation combustion manner, the solid-state nitride should be an easily thermally decomposable compound and the reaction must be well-controlled so that the nitrogen produced by the decomposition can rapidly react with the powdery Al. Otherwise, there will be a resulting high pressure and the reaction is no more operative owing to the fact that the $N_2$ gas is escaping.

SUMMARY OF THE INVENTION

An objective of the present invention is to provide a method of manufacturing a powdery AlN with high quality.

A further object of the present invention is to provide a method of manufacturing a powdery AlN in which the synthesis reaction is rapid, self-propagating and complete and can be performed under a relatively low-pressure.

The present invention provides an efficient technology capable of sucessfully overcoming the problems of the combustion synthesis method for manufacturing the powdery AlN, and capable of producing a high quality powdery AlN. The technology of manufacturing powdery AlN of the present invention has three features:

1) It utilizes powdery Al and solid-state nitrides: The present invention uses powdery Al and solid-state nitrides (e.g., $NaN_3$, $KN_3$, $Ba_3 N_2$ . . . etc.) as the reactants. The reactant powders, in an appropriate proportion, are thoroughly mixed and then moulded into a pellet of a proper shape (e.g., a cylindrical one). During the preparation of the pellet, an appropriate amount of a diluting agent (e.g., the powdery AlN) can also be added therein.

2) The pellet is wrapped up with an igniting agent: The pellet prepared in the previous step is completely wrapped up with a proper igniting agent (e.g., the mixed powdery Ti+C or $Al+Fe_3O_4$). This step can be accomplished by putting the pellet into a mold of the proper size and shape, then pressurizedly covering the pellet with the powdery igniting agent. Before the pellet is wrapped up with the igniting agent, it can firstly be wrapped up with a metal foil (e.g., Al foil), or placed in a porous refractory vessel.

3) Its reaction is executed under a low pressure of $N_2$: The reactant pellet wrapped up with the igniting agent is placed in a vessel filled with $N_2$ gas. The igniting agent is ignited by heating with a proper heating element (e.g., tungsten wire, graphite ribbon, or a laser) by which the igniting agent can be heated to have a temperature up to 800°–1700° C. resulting in ignition and then triggering the combustion of the reactant pellet, thus forming the high quality powdery AlN. Although such reaction can take place in $N_2$ gas of a higher pressure, it only requires an $N_2$ gas pressure of 1–7 atm. The most notable differences between the present invention and the conventional combustion method of manufacturing powdery AlN are that in the present invention, the reactant pellet is wrapped up with an igniting agent, and the reactant pellet is enveloped in the igniting agent after encapsulated in a metal foil or placed in a porous refractory vessel. Wrapping the reactant pellet with an igniting agent requires that the reactant pellet be directly and completely wrapped up with an igniting agent, or the reactant pellet be first covered with a metal foil or be put into a porous refractory vessel and then wrapped up completely with an igniting agent.

Wrapping the reactant pellet with an igniting agent can achieve that (1) the high temperature quickly achieved by the combustion of the igniting agent can rapidly heat the reactant pellet up to a temperature high enough not only to cause the reactant nitride to decompose but also to cause the reaction between the nitrogen (produced by the decomposition of the nitride) and the reactant Al to occur to form AlN; (2) The combustion product of the igniting agent (e.g., TiC or Fe+$Al_2O_3$) is quite dense, and is resistant to the outgoing nitrogen, which will tend to retain therein the nitrogen and enhance the formation of the powdery AlN; (3) When the reactant pellet is covered with metal foil or put into a porous vessel, and then wrapped up with the igniting agent, the interior $N_2$ gas can be preferably retained. In the case of being covered with metal foil, the interior high-pressure $N_2$ gas dispels the molten metal foil to block up some openings from which the $N_2$ gas can escape, thus baffling the $N_2$ gas from escaping. In the case of being put into a porous vessel, the porous vessel itself is resistant to the outgoing $N_2$, thus creating the effect of retaining the $N_2$ gas; (4) Although the combustion product of the igniting agent is quite dense, it has a porosity through which the decomposition products (except $N_2$) of the reactant nitride and other preexisting impurity materials can escape. High purity powdery AlN thus can be formed. Furthermore, the combustion product (e.g., TiC) of the igniting agent is also a valuable product.

It is to be noticed that the above introduction is based on the fact that reactants of powdery Al and the solid-state nitride are mixed in an atomic ratio of Al to N atoms from about 1:1.2 to about 1:2.4 to form the pellet. It has been found that if the ratio is changed to be from about 1:0.2 to about 1:1.0, the reactants will become aluminium nitride whiskers. The present invention can be better understood through the following descriptions with reference to the accompanying drawings.

DETAILED DESCRIPTION OF THE PREFERRED EMBODIMENT

Figure 1:
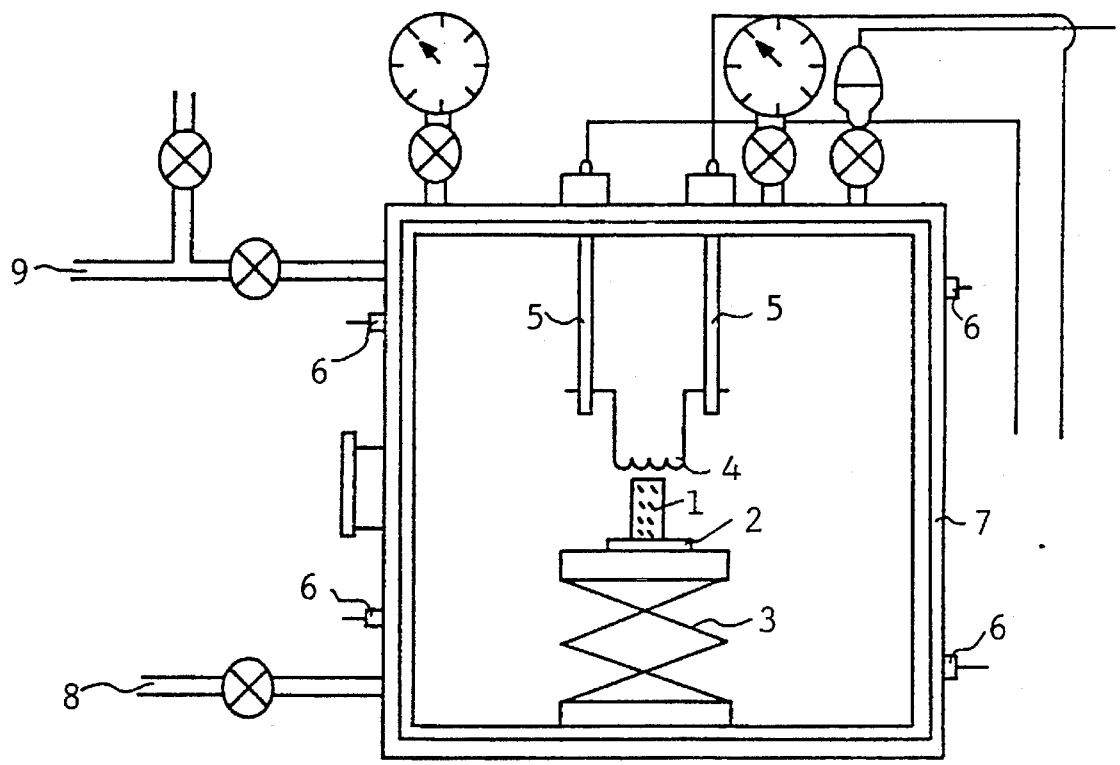
FIG. 1 shows an instrument setup for the combustion-synthesis reaction according to the present invention.
Figure 2:
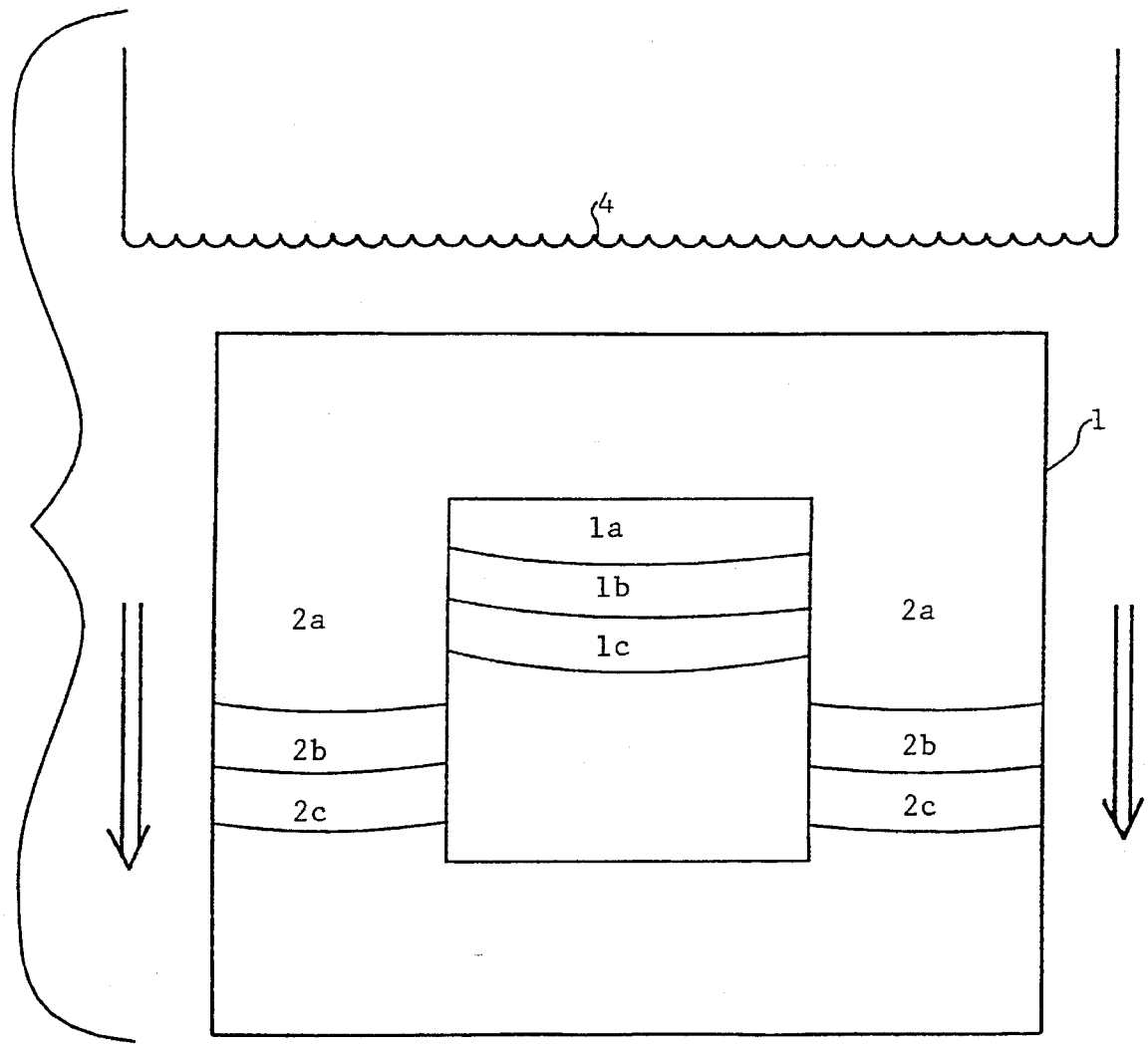
FIG. 2 schematically shows the propagation status of the combustion synthesis reaction according to the present invention.

With reference to FIGS. 1 and 2, the operational procedures and conditions of the present invention will be described in detail hereinafter.

According to the present invention, a method of manufacturing a powdery AlN includes the first step of weighing a powdery Al and a powdery solid-state nitride to let the atomic ratio of the Al to N atoms be less than one. The weighed materials are thoroughly mixed with a ball mill, or the like. The mixed powder is pressed into a pellet of an appropriate shape with a die. The pellet is put into a larger die, and an appropriate amount of an igniting agent is filled into the die. By applying an appropriate pressure, the pellet is pressurizedly wrapped up with the igniting agent. The reactant pellet (1) with the wrapping igniting agent is placed on a refractory plate (2) within a pressure vessel, and the plate (2) is sitting on a height-adjustable platform (3). The platform (3) is utilized to adjust the distance between the reactant pellet (1) and the heating wire (4) in the range of 2–3 mm. The pressure vessel is then sealed airtightly.

The heating electrodes (5) and the thermalcouples (6) for temperature measurement are extended outwards through the wall (7) of the vessel for being operated from outside. The vessel is evacuated to $10^{-1}$ Torr by a vacuum-discharging system (8), and then a high-purity $N_2$ gas is introduced into the vessel till about 5 atm by an $N_2$-supplying system (9). The nitrogen discharging and introducing steps are repeated several times to remove the pre-existing air in the vessel, and to remove the water absorbed on the reactant powders. Then, the high-purity $N_2$ gas is introduced into the vessel to a desired pressure for the synthesis reaction. Finally, a current of several amperes to tens of amperes is supplied to the heating wire (4) via the electrodes (5) in order to trigger the synthesis reaction.

Referring to FIG. 2, the igniting agent wrapping around the reactant pellet (1) is ignited by the heating wire 4 to initiate the reaction forming the product (2a). At the same time, the reaction zone (2b) generates much heat of reaction which heats the adjacent layer (2c) to become a heating zone for the subsequent reaction. Such a self-propagation reaction means that the igniting agent is ignited at one side close to the heating wire (4), and that the reaction propagates by itself to the other side along the direction indicated by arrows in FIG. 2. The heat generated by the reaction of the igniting agent is transfered to the reactant pellet (1), thus triggering the synthesis reaction of the pellet (1), whereby the product, AlN, indicated by the symbol (1a) is formed. At this time, the reaction zone indicated by the symbol (1b) generates much heat of reaction which heats the adjacent layer (1c) to become a heating zone to execute the subsequent synthesis reaction. In brief, the reactant pellet (1) is ignited by heating by the reaction of the igniting agent, and a self-propagation reaction of the pellet (1) also occurs along the direction indicated by the arrows in FIG. 2. When the reaction propagates to the end at the other side, the entire reactant pellet (1) becomes a powdery AlN product. After the product is cooled, a release valve is opened to recover the pressure in the vessel to 1 atm. The vessel is then opened for the removal of the product, and the reaction product of the igniting agent is separated from the powdery AlN product by an appropriate manner, for example by peeling apart the igniting-agent product which is in a laminated and loose structure. Finally, the loose powdery AlN product is obtained with a by-product from the reaction of the igniting agent.

Before the reactant pellet (1) is wrapped up with the igniting agent, the pellet (1) may be wrapped up with an Al foil, or placed in a porous refractory vessel. In both cases, the thickness of the wrapping igniting agent can be thinner, and the $N_2$ pressure needed for reaction can be lower. Other operational procedures and conditions are all the same to those described above.

During manufacturing the AlN of the present invention, the generated high heat not only causes the reactant nitride, to decompose but also causes the other elements except nitrogen to evaporate. Consequently, no impurity element is found in the final AlN product. If NaN is used as a reactant, and Ti+C is used as an igniting agent in the method of the present invention, the chemical reactions can be represented by:

Reaction of igniting agents:

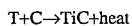
T+C→TiC+heat

Reaction of reactants:

3Al_30 NaN$_3$→3AlN+Na↑(evaporation)+heat

In order to best understand the manufacturing method of the present invention, several examples are described hereinafter. It should be understood, however, that these examples do not intend to limit the scope of the present invention.

EXAMPLE 1

Al powder (−200 mesh) and NaN$_3$ powder are mixed in a 1:1.4 ratio of Al and N atoms, to pressurizedly moulded (under a pressure of 30 kg/cm$^2$) to form a cylinder having a diameter of 1 cm and a length of 0.6 cm. This cylinder is further wrapped up with a mixture of Ti powder (−325 mesh) and graphite powder (−325 mesh) in a 1:1 atomic ratio, and pressurizedly moulded (under a pressure of 40 kg/cm$^2$) to form a final cylinder having a diameter of 1.7 cm and a length of 1.4 cm. The final cylinder is put into a pressure vessel. The vessel is evacuated, and then nitrogen is introduced till 6 atm is obtained. A tungsten wire supplied with a current is used to heat one end of the final cylinder so as to initiate the reaction of the Ti+C, and then the interior formation reaction of AlN is triggered right away. The reaction is completed within about two seconds. The wrapping igniting agents become a TiC in a laminated and loose structure, and the reactants become a white and loose powdery product. An XRD analysis therefor shows that this powdery product entirely is an AlN having a hexagonal crystallization.

EXAMPLE 2

Al powder (−200 mesh) and NaN$_3$ powder are mixed in a 1:1.4 ratio of Al to N atoms, and pressurizedly moulded (under a pressure of 30 kg/cm$^2$) to form a cylinder having a diameter of 1 cm and a length of 1 cm. This cylinder is first wrapped up with an Al foil, then wrapped up with a mixture of Ti powder (−325 mesh) and graphite powder (−325 mesh) in a 1:1 atomic ratio, and pressurizedly moulded (under a pressure of 40 kg/cm$^2$) to form a final cylinder having a diameter of 1.7 cm and a length of 1.4 cm. The final cylinder is put into a pressure vessel. The vessel is evacuated, and then nitrogen is introduced therein till 4 atm is obtained. A tungsten wire supplied with a current is used to heat one end of the final cylinder so as to initiate the reaction of the Ti+C, and then the inner formation reaction of AlN is triggered right away. The reaction is completed within about two seconds. The wrapping igniting agents become a TiC in a laminated and loose structure, and the reactants become a white and loose powdery product. An XRD analysis shows that this powdery product is entirely an AlN having a hexagonal crystallization.

EXAMPLE 3

Al powder (−200 mesh) and NaN$_3$ powder are mixed in a 1:1.4 ratio of Al to N atoms, and pressurizedly moulded (under a pressure of 30 kg/cm$^2$) to form a cylinder having a diameter of 1 cm and a length of 0.6 cm. This cylinder is further wrapped up with a mixture of Ti powder (−325 mesh) and carbon black powder (<100 nm) in a 1:1 atomic ratio, and pressurizedly moulded (under a pressure of 40 kg/cm$^2$) to form a final cylinder having a diameter of 1.7 cm and a length of 1.4 cm. The final cylinder is put into a pressure vessel. The vessel is evacuated, and then nitrogen is introduced therein till 5 atm is obtained. A tungsten wire supplied with a current is used to heat one end of the final cylinder so as to initiate the reaction of the Ti+C, and then the inner formation reaction of AlN is triggered right away. The reaction is completed within about two seconds. The wrapping igniting agents become a porous TiC, and the reactants become a white and loose powdery product. An XRD analysis shows that this powdery product is entirely an AlN having a hexagonal crystal structure.

EXAMPLE 4

Al powder (−200 mesh) and NaN$_3$ powder are mixed in a 1:1.4 ratio of Al to N atoms, and pressurizedly moulded (under a pressure of 30 kg/cm$^2$) to form a cylinder having a diameter of 1 cm and a length of 1 cm. This cylinder is first wrapped with an Al foil, then warpped up with a mixture of Ti powder (−325 mesh) and carbon black powder (<100 nm) in a 1:1 atomic ratio, and pressurizedly moulded (under a pressure of 40 kg/cm$^2$) to form a final cylinder having a diameter of 1.7 cm and a length of 1.4 cm. The final cylinder is put into a pressure vessel. The vessel is evacuated, and then nitrogen is introduced therein till 4 atm is obtained. A tungsten wire supplied with a current is used to heat one end of the final cylinder so as to initiate the reaction of the Ti+C, and then the inner formation reaction of AlN is triggered right away. The reaction is completed within about two seconds. The wrapping igniting agents become a porous TiC, and the reactants become a white and loose powdery product. An XRD analysis shows that this powdery product is entirely an AlN having a hexagonal crystal structure.

EXAMPLE 5

Al powder (−200 mesh) and NaN$_3$ powder are mixed in a 1:1.4 ratio of Al and N atoms, and put into a porous graphite vessel having an inner diameter of 1.0 cm, a length of 1.0 cm, and a thickness of 0.7 cm. This vessel is further wrapped up with a mixture of Ti powder (−325 mesh) and graphite powder (−325 mesh) in a 1:1 to ratio, and pressurizedly moulded (under a pressure of 40 kg/cm$^2$) to form a final cylinder having a diameter of 3 cm and a length of 1.4 cm. The final cylinder is put into a pressure vessel. The vessel is evacuated and then nitrogen is introduced therein till 5 atm is obtained. A tungsten wire supplied with a current is used to heat one end of the final cylinder so as to initiate the reaction of the Ti+C, and then the inner formation reaction of AlN is triggered right away, The reaction is completed within about two seconds. The wrapping igniting agents becomes a Ti+C in a laminated and loose structure, and the reactants become a white and loose powdery product. An XRD analysis shows that this powdery product is entirely an AlN having a hexagonal crystal structure.

EXAMPLE 6

Al powder (−200 mesh) and $KN_3$ powder are mixed in a 1:2 ratio of Al to N atoms, and pressurizedly moulded (under a pressure 30 kg/cm$^2$) to form a cylinder having a diameter of 1 cm and a length of 1 cm. This cylinder is first wrapped up with an Al foil, then wrapped up with a mixture of Ti powder (−325 mesh) and carbon black powder (<100 nm) in a 1:1 atomic ratio, and pressurizedly moulded (under a pressure 40 kg/cm$^2$) to form a final cylinder having a diameter of 1.7 cm and a length of 1.4 cm. The final cylinder is put into a pressure vessel. The vessel is evacuated, and then nitrogen is introduced therein till 4 atm obtained. A tungsten wire supplied with a current is used to heat one end of the final cylinder so as to initiate the reaction of the Ti+C, and then the inner formation reaction of AlN is triggered right away. The reaction is completed within about two seconds. The wrapping igniting agents become a porous TiC, and the reactants become a white and loose powdery product. An XRD analysis shows that this powdery product is entirely an AlN having a hexagonal crystal structure.

EXAMPLE 7

Al powder (−200 mesh) and $Ba_3N_2$ powder are mixed in a 1:1.8 ratio of Al to N atoms, and pressurizedly moulded (under a pressure 30 kg/cm$^2$) to form a cylinder having a diameter of 1 cm and a length of 1 cm. This cylinder is first wrapped up with an Al foil, then wrapped up with a mixture of Al powder (−200 mesh) and $Fe_3O_4$ powder (−325 mesh) in an 8:3 molecular ratio, and pressurizedly moulded (under a pressure 40 kg/cm$^2$) to form a final cylinder having a diameter of 1.7 cm and a length of 1.4 cm. The final cylinder is put into a pressure vessel. The vessel is evacuated, and then nitrogen is introduced therein till 5 atm is reached. A tungsten wire supplied with a current is used to heat one end of the final cylinder so as to initiate the reaction of the Al+$Fe_3O_4$, and then the inner formation reaction of AlN is triggered right away. The reaction is completed within about two seconds. The wrapping igniting agents become a porous Fe+$Al_2O_3$, and the reactants become a white and loose powdery product. An XRD analysis shows that this powdery product is entirely an AlN having a hexagonal crystal structure.

EXAMPLE 8

Al powder (−200 mesh) and $NaN_3$ powder are mixed in a 1:1.4 ratio of Al to N atoms, and pressurizedly moulded (under a pressure 30 kg/cm$^2$) to form a cylinder having a diameter of 1 cm and a length of 1 cm. This cylinder is first wrapped up with an Al foil, then wrapped up with a mixture of Ti powder (−325 mesh) and carbon black powder (<100 nm) in a 1:1 atomic ratio, and pressurizedly moulded (under a pressure 40 kg/cm$^2$) to form a final cylinder having a diameter of 1.7 cm and a length of 1.4 cm. The final cylinder is put into a pressure vessel. The vessel is evacuated, and then nitrogen is introduced therein till 4 atm is reached. A graphite ribbon supplied with a current is used to heat one end of the final cylinder so as to initiate the reaction of the Ti+C, and then the inner formation reaction of AlN is triggered right away. The reaction is completed within about two seconds. The wrapping igniting agents become a porous TiC, and the reactants become a white and loose powdery product. An XRD analysis shows that this powdery product is entirely an AlN having a hexagonal crystal structure.

EXAMPLE 9

Al powder (−200 mesh) and $NaN_3$ powder are mixed in a 1:1.4 ratio of Al to N atoms, and pressurizedly moulded (under a pressure 30 kg/cm$^2$) to form a cylinder having a diameter of 1 cm and a length of 1 cm. This cylinder is first wrapped up with an Al foil, then wrapped up with a mixture of Ti powder (−325 mesh) and carbon black powder (<100 nm) in a 1:1 atomic ratio, and pressurizedly moulded (under a pressure 40 kg/cm$^2$) to form a final cylinder having a diameter of 1.7 cm and a length of 1.4 cm. The final cylinder is put into a pressure vessel. The vessel is evacuated, and then nitrogen is introduced therein till 4 atm is reached. A laser is used to heat one end of the final cylinder so as to initiate the reaction of the Ti+C, and then the inner formation reaction of AlN is triggered right away. The reaction is completed within about two seconds. The wrapping igniting agents become a porous TiC, and the reactants become a white and loose powdery product. An XRD analysis shows that this powdery product is an AlN having a hexagonal crystal structure.

It has been found that if the above nine examples are respectively executed once more except that Al powder (−200 mesh) and solid-state nitride powder are mixed in a 1:0.8 1:0.6, or 1:0.4, instead of being 1:1.4, 1:1.8 or 1:2, ratio of Al to N atoms, the reactants will become aluminum nitride whiskers.

While the invention has been described in terms of what are presently considered to be the most practical and preferred embodiments, it is to be understood that the invention needs not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What we claim is:

1. A method of manufacturing a powdery AlN comprising the steps of:

a) providing an airtight vessel;

b) preparing a powdery Al and an active solid-state nitride;

c) wrapping said powdery Al and said solid-state nitride with an igniting agent;

d) putting said wrapped Al and nitride into said airtight vessel;

e) evacuating said airtight vessel and then introducing an $N_2$ gas into said airtight vessel; and f) igniting said igniting agent.

2. A manufacturing method according to claim 1, wherein said powdery Al and said solid-state nitride are completely wrapped up with said igniting agent.

3. A manufacturing method according to claim 1, further comprising a step g) of mixing said powdery Al and said solid-state nitride before said step c) is executed.

4. A manufacturing method according to claim 3, further comprising a step h) of pressurizedly moulding said powdery Al and said solid-state nitride between said steps g) and c).

5. A manufacturing method according to claim 4, wherein said powdery Al and said solid-state nitride are pressurizedly moulded into a suitable shape.

6. A manufacturing method according to claim 1, wherein said solid-state nitride is selected from the group consisting of $Na_3N$, $K_3N$, $Ba_3N_2$, and any combination thereof.

7. A manufacturing method according to claim 1, wherein said igniting agent is selected from the group consisting of powdery Ti and graphite, powder Ti and carbon black, and powdery $Al+Fe_3O_4$.

8. A manufacturing method according to claim 1, further comprising a step i) of wrapping up said Al and said nitride with a metal foil before said step c).

9. A manufacturing method according to claim 8, wherein said metal foil is made of Al.

10. A manufacturing method according to claim 1, further comprising a step j) of putting said powdery Al and said solid-state nitride into a porous vessel before said step c) is executed.

11. A manufacturing method according to claim 1, wherein said $N_2$ gas has a pressure ranged between about 1 and about 7 atm.

12. A manufacturing method according to claim 1, wherein said powdery Al and said solid-state nitride have an atomic ratio between Al to N atoms of less than 1.

13. A manufacturing method according to claim 1, wherein said step f) is executed by heating said igniting agent with a heating element selected from the group consisting of W resistor, graphite ribbon and laser.

14. A manufacturing method according to claim 1, wherein said airtight vessel is a pressure vessel.

15. A manufacturing method according to claim 1, wherein said powdery Al and said solid-state nitride in said step c) are mixed in an atomic ratio of Al to N atoms from about 1:1.2 to about 1:2.4.

16. A manufacturing method according to claim 1, wherein said powdery Al and said solid-state nitride in said step c) are mixed in an atomic ratio of Al to N atoms from about 1:0.2 to about 1:1.0.

17. A manufacturing method according to claim 16, wherein said powdery AlN is aluminium nitride whiskers.

* * * * *